United States Patent [19]

Gehring et al.

[11] Patent Number: 4,609,882

[45] Date of Patent: Sep. 2, 1986

[54] OSCILLATOR/DEMODULATOR CIRCUIT ARRANGEMENT FOR AN INDUCTIVE PROXIMITY SWITCH

[75] Inventors: Gerhard Gehring, Unterhaching; Franz Hödlmayr, Munich, both of Fed. Rep. of Germany

[73] Assignee: Siemens Aktiengesellschaft, Berlin and Munich, Fed. Rep. of Germany

[21] Appl. No.: 754,869

[22] Filed: Jul. 12, 1985

[30] Foreign Application Priority Data

Jul. 13, 1984 [DE] Fed. Rep. of Germany ....... 3425937

[51] Int. Cl.$^4$ ........................... G01V 3/11; H03B 5/12
[52] U.S. Cl. ..................... 331/65; 324/207; 324/236; 324/327; 331/117 R
[58] Field of Search ............... 331/65, 117 R, 167, 331/168; 324/327, 222, 236, 207, 208, 237; 340/941, 551, 552, 561

[56] References Cited

U.S. PATENT DOCUMENTS 4,001,718 1/1977 Wilson et al. .................... 331/65
4,543,527 9/1985 Schuchmann et al. ......... 331/167 X

FOREIGN PATENT DOCUMENTS 2075201 11/1981 United Kingdom .

OTHER PUBLICATIONS

Electronique et Microelectronique Industrielle, Jun. 15, 1975, pp. 54 to 56.
L'Electricite Electronique Moderne, vol. 44, No. 280, Apr./May 1975, pp. 66 to 68.

*Primary Examiner*—Siegfried H. Grimm
*Attorney, Agent, or Firm*—Herbert L. Lerner; Laurence A. Greenberg

[57] ABSTRACT

An oscillator/demodulator circuit arrangement for an inductive proximity switch with a transistor amplifier stage having an input circuit containing an attenuatable resonance circuit and having an output circuit, with a regenerative feedback from the output circuit to the input circuit of the transistor amplifier stage, the input circuit of the transistor amplifier stage having a limiter branch therein, includes a double current mirror operatively connected in the input circuit of the transistor amplifier stage and including a first and a second current mirror coupled to one another in a manner that currents supplied thereby are subtracted from one another at a circuit output, the transistors in the second current mirror having a larger emitter surface ratio in comparison with the emitter surface ratio of the transistors in the first current mirror.

12 Claims, 7 Drawing Figures

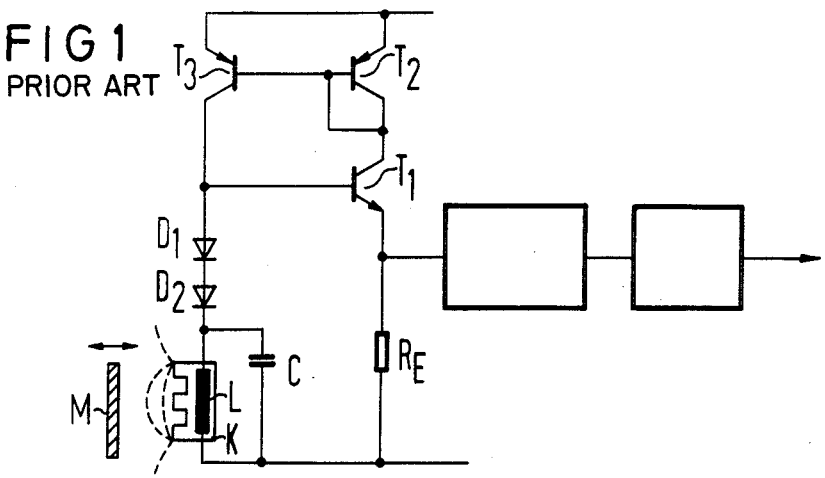
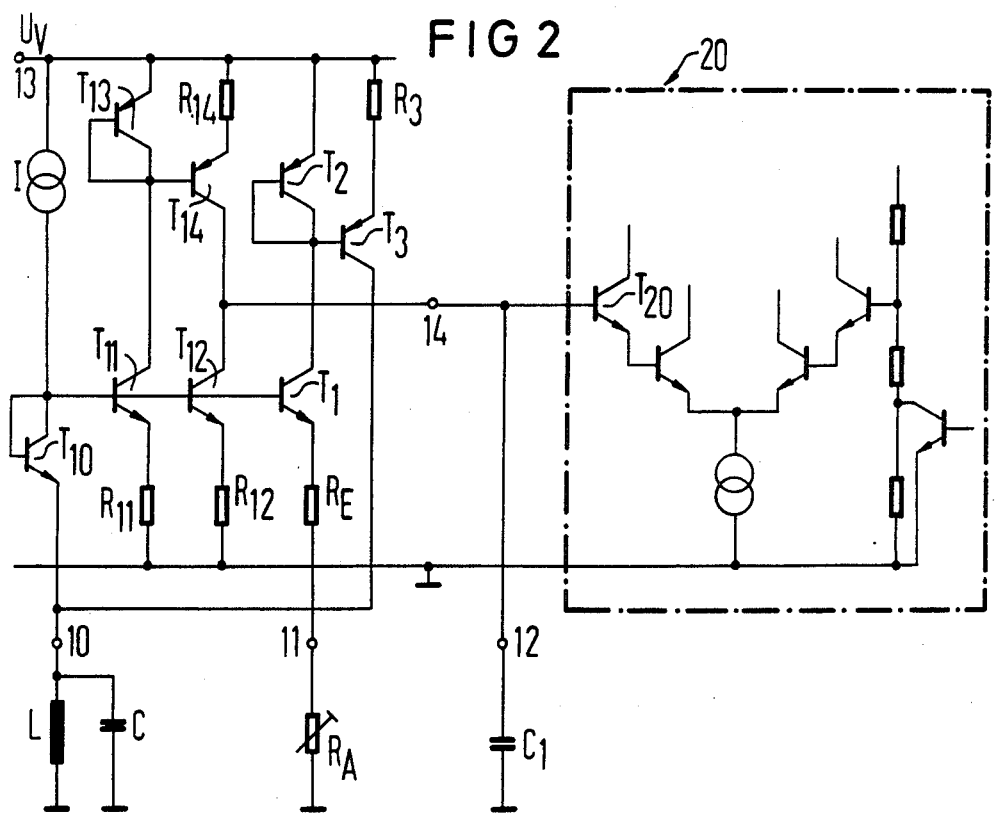

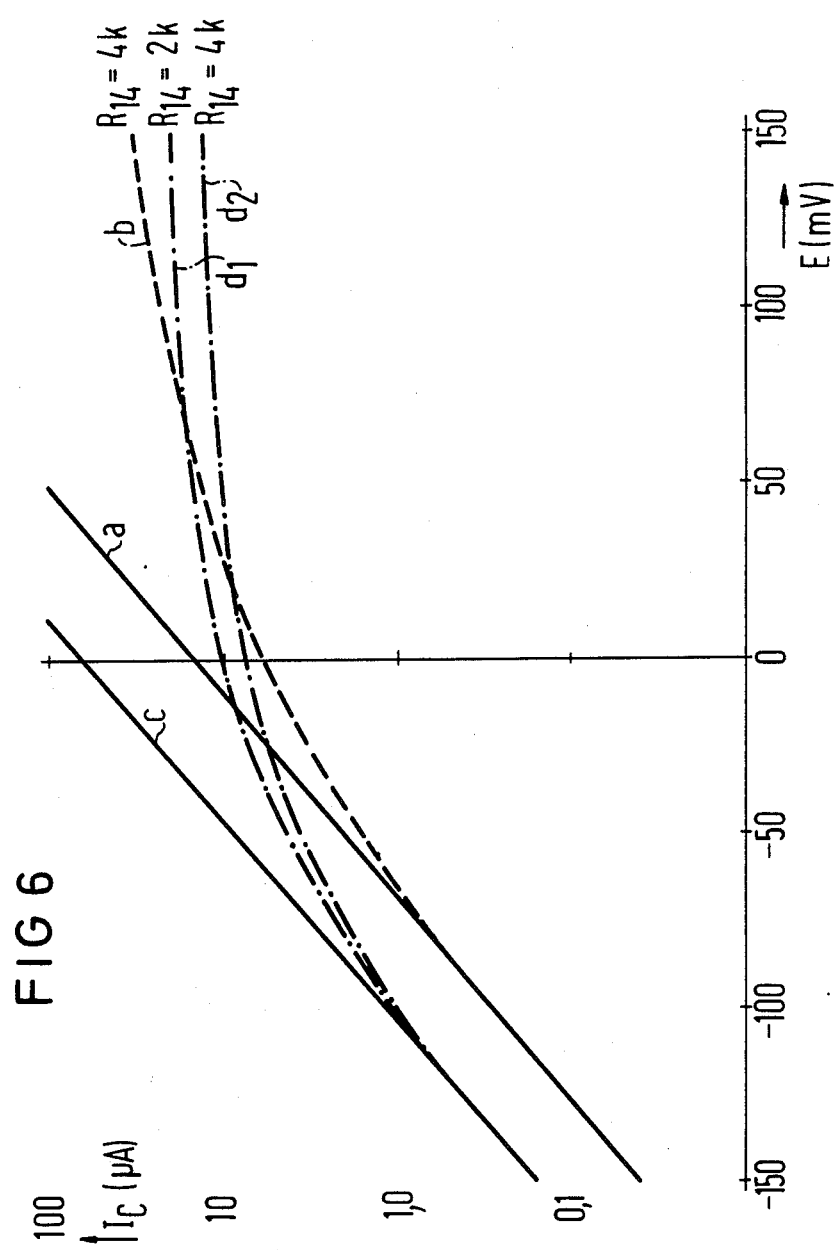

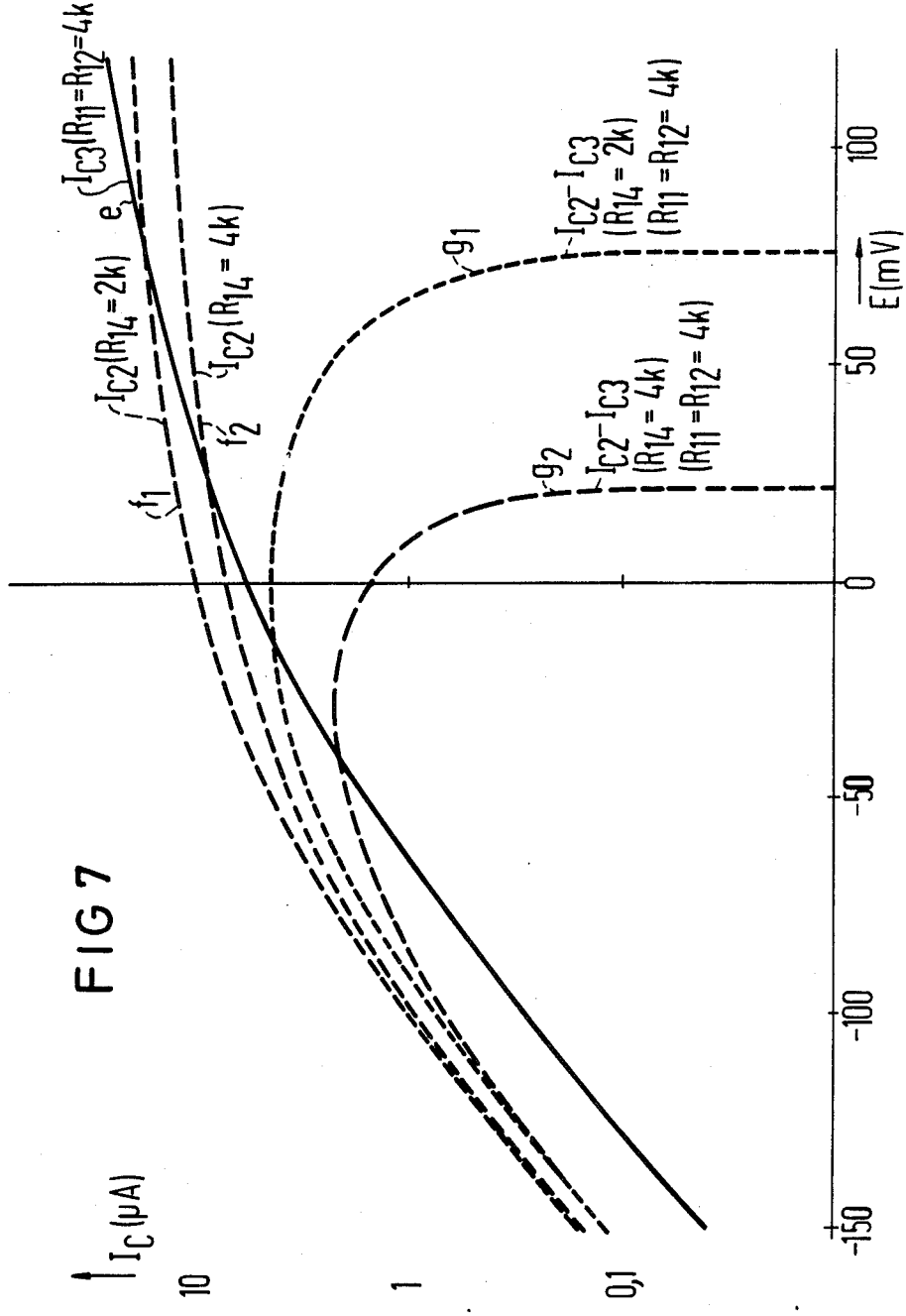

OSCILLATOR/DEMODULATOR CIRCUIT ARRANGEMENT FOR AN INDUCTIVE PROXIMITY SWITCH

The invention relates to an oscillator/demodulator circuit arrangement for an inductive proximity switch and, more particularly, to such a circuit arrangement with a transistor amplifier stage having an input circuit containing an attenuatable resonance circuit and an output circuit, with a regenerative feedback from the output circuit to the input circuit, the input circuit having a limiter branch therein.

A circuit arrangement of this kind is known, for example, from the magazine "Electronique et Microelectronique Industrielle", of June 15, 1975, Pages 54 to 56. The principles of a conventional circuit arrangement of this type are illustrated in FIG. 1. This circuit arrangement contains a transistor amplifier stage, formed by a transistor $T_1$ with an emitter resistor $R_E$, as well as a regenerative feedback realized by a current mirror formed of transistors $T_2$ and $T_3$. The base circuit of the transistor $T_1$ of the amplifier stage contains a parallel resonance circuit, formed by a capacitor C and a coil L, as well as a series arrangement of two diodes $D_1$ and $D_2$ connected in series with this resonance circuit. The coil L of the resonance circuit has an open semi-monocoque or half-shell ferrite core K, a resultant electromagnetic field having been diagrammatically indicated by broken lines in FIG. 1. If the core K is approached by a metal plate or a metal lug M, part of the aforementioned field is absorbed by this metal plate or lug M, and the oscillating circuit is correspondingly damped. As a result, the oscillation amplitude becomes smaller or the oscillation breaks off completely if the loop amplification becomes smaller than one.

In a circuit arrangement for a proximity switch, a demodulator and an integrator which have been shown only diagrammatically in FIG. 1 have been post-connected to the aforedescribed oscillator, and need not be discussed in further detail therein.

In the aforedescribed oscillator, the diodes $D_1$ and $D_2$ serve to produce a reference voltage. One of the diodes serves to compensate the threshold voltage of the base-emitter path of the transistor $T_1$ of the amplifier stage, whereas the other diode determines the voltage drop across the emitter resistor $R_E$ and thus the emitter current. The emitter current can increase only to the point at which the voltage drop across the emitter resistor, plus the base emitter voltage of the transistor $T_1$, is equal to the reference voltage applied to the base of this transistor, because the direct-current voltage drop across the winding of the coil L is negligible. Consequently, the oscillating amplitude of the oscillator has the reference voltage of a diode forward voltage as a peak value.

Consequently, the temperature response of this reference voltage also has an influence upon the oscillating amplitude.

Furthermore, the oscillating amplitude with respect to ground has both signs corresponding to a diode forward voltage of 0.7 V maximum in the plus direction and, then, as a result of the formation of a resonance oscillation across the oscillating circuit L, C, also −0.7 V in the minus direction.

Because, in integrated embodiments, the transistors are usually formed in isolation tubs in an epitaxial layer on a substrate, the diode which is formed by the collector tub and the substrate can become conductive if negative voltages exceeding 0.6 to 0.7 V are connected between the substrate (ground or minus terminal) and a collector tub. The danger then exists of couplings between tubs which should be insulated and decoupled from one another.

Furthermore, the negative half waves of the oscillations are limited by the aforementioned substrate diode whereby, in turn, the quality of the oscillator is restricted.

It is an object of the invention to provide an oscillator/demodulator circuit arrangement for an inductive proximity switch which is more temperature-stable and largely free of substrate diode effects.

With the foregoing and other objects in view, there is provided, in accordance with the invention, an oscillator/demodulator circuit arrangement for an inductive proximity switch with a transistor amplifier stage having an input circuit containing an attenuatable resonance circuit and having an output circuit, with a regenerative feedback from the output circuit to the input circuit of the transistor amplifier stage, the input circuit of the transistor amplifier stage having a limiter branch therein, comprising a double current mirror operatively connected in the input circuit of the transistor amplifier stage and including a first and a second current mirror coupled to one another in a manner that currents supplied thereby are subtracted from one another at a circuit output the transistors in the second current mirror having a larger emitter surface ratio in comparison with the emitter surface ratio of the transistors in the first current mirror.

In accordance with another feature of the invention, the first current mirror is located in the input circuit of the transistor amplifier stage and the second current mirror is driven by the first current mirror.

In accordance with an additional feature of the invention, the first current mirror comprises a transistor connected as a diode and acting as reference element for the first current mirror and as compensation element for a threshold voltage of a base-emitter path of the transistor amplifier stage, two transistors commonly controlled by the first-mentioned transistor connected as a diode, and a respective resistor located in an emitter arm of the respective two controlled transistors.

In accordance with an added feature of the invention, the resistors in the emitter arms of the two control transistors of the first current mirror are of equal value.

In accordance with a further feature of the invention, the second current mirror has one transistor connected as a diode and acting as reference element, another transistor controlled by the one transistor, and a resistor located in an emitter arm of the other and controlled transistor.

In accordance with again another feature of the invention, the second current mirror is controlled by one of the two controlled transistors of the first current mirror.

In accordance with again an additional feature of the invention, the first and the second current mirrors have respective outputs which are interconnected to form the circuit output.

In accordance with again an added feature of the invention, the transistors of the first current mirror are of the opposite conductivity type to that of the transistors of said second current mirror.

In accordance with again a further feature of the invention, the transistors of the first current mirror have emitter surface ratios which are substantially equal to 1.

In accordance with still another feature of the invention, the emitter surface of the other and controlled transistor of the second current mirror is large compared to the emitter surface of the one transistor acting as reference element.

In accordance with still an additional feature of the invention, the emitter surface ratios of the one transistor acting as reference element and of the other and controlled transistor in the second current mirror are equal to 1:4.

In accordance with a concomitant feature of the invention, the respective resistors in the emitter arms of the two controlled transistors of the first current mirror are greater than the resistor in the emitter arm of the other and controlled transistor of the second current mirror.

Other features which are considered as characteristic for the invention are set forth in the appended claims.

Although the invention is illustrated and described herein as embodied in an oscillator/demodulator circuit arrangement for an inductive proximity switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1, as aforementioned, is a circuit diagram of a conventional oscillator/demodulator circuit arrangement;

FIG. 2 is a circuit diagram of an embodiment of an oscillator/demodulator circuit arrangement in accordance with the invention;

FIGS. 6 and 7 are respective current-voltage plot diagrams for explaining the manner of operation of the circuit arrangement according to the invention shown in FIG. 2.

Figure 5:
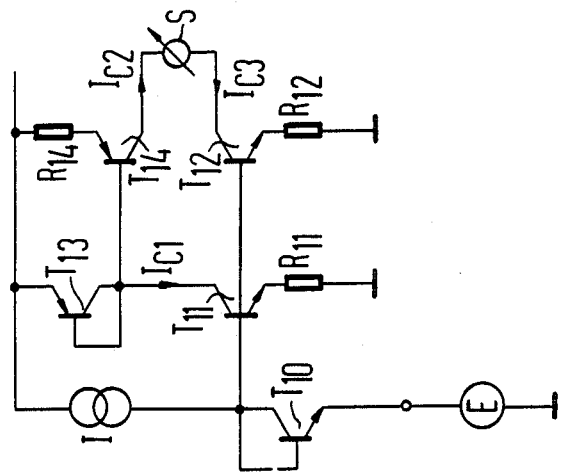
FIGS. 3 to 5 are respective partial circuit diagrams for explaining the manner of operation of the circuit arrangement according to the invention shown in FIG. 2.

In the circuit arrangement according to the invention shown in FIG. 2, the elements $T_1$ to $T_3$, $R_E$ and L, C correspond to the aforedescribed likewise identified elements of the heretofore known circuit arrangement shown in FIG. 1. Because the circuit arrangement according to the invention is preferably constructed in integrated circuit technology, an input terminal 10 is shown free, and this terminal is externally connectible to the parallel resonance circuit L, C. This applies likewise to free terminals 11, 12 and 13. The terminal 11 is externally connectible to a resistor $R_A$ which, in a conventional manner, serves to adjust the switching interval (spacing of the metal plate or metal lug M at which the proximity switch switches) as well as the switching interval hysteresis for an inductive proximity switch which contains the oscillator/demodulator circuit arrangement according to the invention. To that end, reference is made to the publication referred to in the introduction hereto which describes the heretofore known circuit arrangement illustrated in FIG. 1.

An integration capacitor $C_1$ is externally connectible to the terminal 12 and has a manner of operation which will not be discussed in detail herein because the operation thereof is not essential to the invention of the instant application.

At the terminal 13, a supply voltage $U_V$ is feedable into the circuit arrangement.

The circuit arrangement illustrated in FIG. 2 also contains a transistor $T_{10}$ which is connected as a diode and energized by a current source I, and which acts, on the one hand, as a compensation element for the threshold voltage of the base-emitter path of the transistor $T_1$ which forms the amplifier stage of the oscillator/demodulator. In this respect, the mode of operation of this transistor $T_{10}$, which is connected as a diode, corresponds to the mode of operation of one of the diodes in the previously known circuit arrangement shown in FIG. 1. As is explained hereinafter in further detail, however, the function of this transistor $T_{10}$, which is connected as a diode, goes beyond the function of the corresponding diode in the heretofore known circuit arrangement shown in FIG. 1, so that the modes of operation of the two components are not entirely identical.

In the circuit arrangement according to the invention illustrated in FIG. 2, the transistor $T_{10}$ which is connected as a diode, together with two further transistors $T_{11}$ and $T_{12}$, each having an emitter path containing respective resistors $R_{11}$ and $R_{12}$ connected to ground, forms a first current mirror, the transistor $T_{10}$, which is connected as a diode, serving as a reference element for this first current mirror, and the two transistors $T_{11}$ and $T_{12}$, each having the respective emitter resistor $R_{11}$, $R_{12}$, being commonly driven across the bases thereof by this reference element. The transistor $T_{10}$, which serves as reference element and is connected as a diode, and the bases of the transistors $T_{11}$ and $T_{12}$ of the first current mirror, and the base of the transistor $T_1$ which forms the amplifier stage are connected to one another; this connection will be referred to in the following as "base bus".

The circuit arrangement according to the invention illustrated in FIG. 2 also contains a second current mirror which is formed by a transistor $T_{13}$, connected as a diode, as well as by a transistor $T_{14}$, with a resistor $R_{14}$ connected to the supply voltage, in the emitter arm. In this second current mirror, the transistor $T_{13}$, which is connected as a diode, forms a reference element which controls the transistor $T_{14}$. In the two current mirrors, the collector-emitter paths of the transistors $T_{11}$, $T_{13}$ and $T_{12}$, $T_{14}$, respectively, are connected in series. The transistors $T_{10}$, $T_{11}$, $T_{12}$ of the first current mirror are of opposite conductivity type to that of the transistors $T_{13}$, $T_{14}$ of the second current mirror. In addition, the resistors $R_{11}$, $R_{12}$ in the emitter arms of the control transistors $T_{11}$, $T_{12}$ of the first current mirror are greater than the resistor $R_{14}$ in the emitter arm of the controlled transistor $T_{14}$ in the second current mirror.

The point of connection of the collectors of the transistors $T_{12}$ and $T_{14}$ is disposed at an output 14 of the oscillator/demodulator circuit arrangement in accordance with the invention.

As is apparent, the two aforedescribed current mirrors form a double current mirror which is effective in the input circuit of the transistor amplifier stage $T_1$, the currents which they supply i.e. the collector currents of the transistors $T_{12}$ and $T_{14}$, being subtracted from one another at the circuit output 14.

In order to indicate that the oscillator/demodulator circuit arrangement according to the invention must supply a current for following stages in an inductive proximity switch, FIG. 2 also diagrammatically and schematically illustrates a Schmitt trigger 20 within which only an input transistor $T_{20}$ has been identified. The Schmitt trigger 20 represents a stage which is known per se and which consequently will not be explained in further detail. The important point is simply that the oscillator/demodulator circuit arrangement must supply an output current for the control of the transistor $T_{20}$ in the Schmitt trigger, as will be explained herein in further detail with reference to FIGS. 3 to 7.

Figure 3:
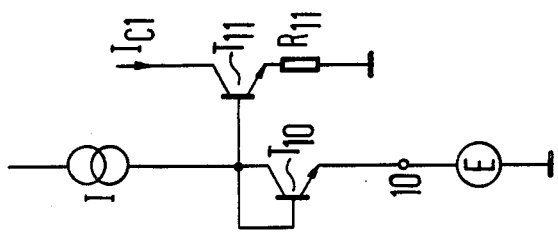

In order to be able to explain the mode of operation of the circuit in accordance with the invention, as shown in FIG. 3, a source E, which supplies a variable, impressed voltage, is connected to the terminal 10 in place of the resonance circuit L, C according to FIG. 2. By way of further explanation it is initially assumed that the transistor $T_{10}$, which is connected as a diode, is continuously traversed by a current of 10 $\mu$A, for example, supplied by the current source 1. For standard structures, a forward voltage of 620 mV is then measured across this transistor $T_{10}$ which is connected as a diode. It is further assumed that the transistor $T_{10}$, which is connected as a diode, and the transistors $T_{11}$, $T_{12}$ and $T_1$ are of identical construction.

If the voltage supplied by the source E is equal to zero, the transistors $T_{11}$, $T_{12}$ and $T_1$ conduct the same current for as long as the respective resistors $R_{11}$, $R_{12}$ and $R_E$ are inactive.

If the voltage supplied by the source E is varied, for example, from $-150$ mV to $+150$,V, as illustrated in the diagram in FIG. 6, the collector currents of the aforementioned transistors vary in accordance with the conventionally known diode equation for the base-emitter path of transistors. This relationship is plotted by a straight line a in the diagram shown in FIG. 6 wherein the collector current $I_C$ is logarithmically plotted on the ordinate.

If the emitter resistors are active, however, the course of the collector currents corresponding to curve b is located beneath the original curve a. For as long as the voltage drop across the emitter resistors remains considerably smaller than approximately 10 mV, the deviation from the curve a is hardly noticeable. Based upon the aforementioned logarithmic diode law, an increase in the base-emitter control voltage of 1 mV always means an increase in the collector current of 4%. However, the greater the voltage drop becomes across the emitter resistors, the greater is the deviation from the curve a.

In the case of larger emitter surfaces of a controlled transistor in a current mirror, for example by a factor m, the collector current also increases by this factor m for as long as the emitter resistor is inactive. This situation is represented by a curve c in the plot diagram of FIG. 6. This curve c runs exactly parallel to the curve a at an interval or spacing m. When the emitter resistor is active, as in the case of curves a and b, a deviation from a straight line occurs as represented by curves d1 and d2, where the latter two curves apply to different values of the emitter resistor. With a surface ratio m equal to 4, in particular, a base-emitter control voltage reduced by approximately 36 mV is required for the same collector current compared with the reference structure. In accordance with the smaller base-emitter-control voltage which is needed, the voltage drop across the emitter resistor can be greater for the same collector current. As a result, the curves d1 and d2, for different values of the emitter resistor, deviate more noticeably from the curve c than does the curve b from the curve a.

The conditions represented in curve a correspond to a current mirror as illustrated in FIG. 3, whereas those represented in curve b correspond to the current mirror $T_{10}$, $T_{11}$, $T_{12}$ and $T_1$ (referred to hereinafter as "current bank").

Figure 4:
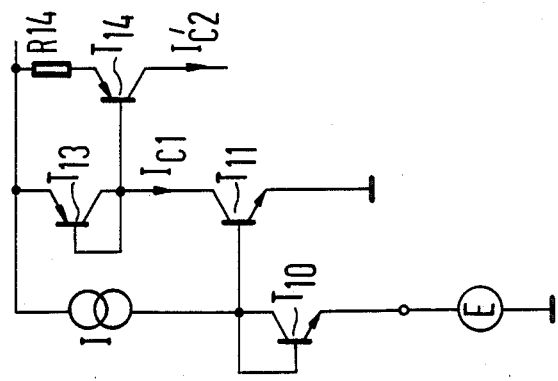

The conditions represented, respectively, by the curve c and by the curves d1, d2, correspond, respectively, to a current mirror shown in FIG. 4 and to the current mirror $T_{13}$, $T_{14}$, $R_{14}$ driven by the collector current of the transistor $T_{11}$ which is identified by $I_{cl}$ in FIGS. 3 to 5.

The difference current which flows into the output 14 corresponds approximately to the difference between the curves b and d1, d2 according to FIG. 6. This is represented on FIG. 5 in such manner that the connection between the collectors of the transistors $T_{14}$ and $T_{12}$ has been considered to be interrupted and the difference between the collector current designated $I_{c2}$ and $I_{c3}$, respectively, is measured by a measuring instrument S. The difference $I_{c2}-I_{c3}$ is represented in the diagram of FIG. 7 for the respective course d1 and d2, respectively, according to FIG. 6 in the form of curves g1 and g2, respectively. The currents $I_{c3}$ and $I_{c2}$ are represented in the diagram in FIG. 7 by curves e, as well as 11, 12, the curves F1 and f2, corresponding to the curves d1 and d2 as shown in FIG. 6, again applying to different values of the emitter resistors. Also in the diagram according to FIG. 7, the current has been logarithmically plotted on the ordinate.

As can be seen from the diagram of FIG. 7, the difference current $I_{c2}-I_{c3}$ corresponding to the curves g1, g2 is positive in the entire part of the drawing plane to the left hand side of a respective intersection point of the curves F1, f2, and e, i.e. the current $I_{c2}$ coming from the collector of the pnp-transistor $T_{14}$ is greater than the collector current $I_{c3}$ of the npn-transistor $T_{12}$. In this part, the Schmitt trigger 20 corresponding to FIG. 2 is above and to the right-hand side thereof, respectively, the gradient of the difference current falls steeply and finally changes the sign so that the Schmitt trigger 20 corresponding to FIG. 2 is deactivated.

The difference current curve g1, g2 has virtually rectifier characteristics. If the control voltage supplied by the source E according to FIGS. 3 to 5 rises above the respective aforementioned intersection point, the npn-transistor $T_{12}$ becomes saturated. The law that the base current is equal to the quotient of the collector current and current amplification then no longer applies. A substantial increase occurs in the base current so that the current bank becomes inactive.

Whereas the impedance of the base bus, formed by the interconnected bases of the transistors $T_{11}$, $T_{12}$ and $T_1$, was previously very high (approximately equal to the product of the values of the emitter resistances and the current amplification), it is reduced by the factor of the current amplification for control voltages which are greater than those voltages which correspond to the aforementioned intersection points shown in FIG. 7.

The feedback path of the oscillator/attenuating circuit arrangement according to FIG. 2 is closed via the transistor $T_1$, which forms the oscillator amplifier stage, and via the current mirror $T_2$, $T_3$, $R_3$. In place of the control signal source E assumed to be provided for purposes of explanation in accordance with FIGS. 3 to 5, the input terminal 10 is connected to the parallel resonance circuit L, C of a proximity switch, as previously mentioned in the introduction hereto. An increase in the voltage in this resonance circuit results in an increasing current through the transistor $T_1$. The latter current is reflected via the current mirror $T_2$, $T_3$, $R_3$ and returned to the resonance circuit (the resistance $R_3$ has only a given stabilizing effect). This current likewise rises. At the location of the impedance of the resonance circuit this leads, in turn, to an increase in the voltage, this effect being parallel to the triggering i.e. a regenerative feedback is provided as is required for triggering every oscillation.

The circuit arrangement shown in FIG. 2 contains a plurality of current sources and current sinks, respectively, in the heretofore explained sense, which are commonly controlled by the control voltage at the input terminal 10. The transistors $T_{13}$, $T_{14}$ of the second current mirror have different emitter-surface ratios, the emitter-surface ratios of the transistor $T_{13}$ acting as reference element, and of the controlled transistor $T_{14}$ being, in particular, equal to one, or do not differ very much therefrom. In particular the resistors $R_{11}$, $R_{12}$ in the emitter arms of the controlled transistors $T_{11}$, $T_{12}$ in the first current mirror are also greater than the resistor $R_{14}$ in the emitter arm of the controlled transistor $T_{14}$ in the second current mirror.

For a control voltage of zero (when the emitter resistor $R_{11}$ is inactive), a current which is equal to the current impressed into the diode $T_{10}$ flows through the current sink (FIG. 3) formed by the transistors $T_{10}$ and $T_{11}$ (which have equal surface ratios). The curve of the output current $I_{c1}$ (FIG. 3) as a function of the input control voltage corresponds to the curve b in the diagram shown in FIG. 6.

This current $I_{c1}$ flows, in accordance with FIG. 4, into the current source formed by the pnp-transistor $T_{13}$, $T_{14}$ (having different surface ratios). The current $I'_{c2}$ supplied by this current source exceeds the current $I_{c1}$ by the factor m, when m is the factor by which the emitter surface of the transistor $T_{14}$ exceeds that of the transistor $T_{13}$. This applies for as long as only a negligibly small voltage drop occurs across the corresponding emitter resistor $R_{14}$. For high currents, however, on account of the then greater voltage drop, the current $I_{c2}$ of this current source rises relatively less steeply than the current $I_{c3}$ in the transistor $T_{12}$ of FIG. 5 which forms a current sink. This fact is represented in the diagram of FIG. 7 for different values of the resistor $R_{14}$ in the respective curves f1 and f2 which correspond to the curves d1, d2 in FIG. 6.

The succeeding circuit in the form of the Schmitt trigger 20 illustrated in FIG. 2 is driven by the output terminal 14 i.e. by the connection point of the collectors of the transistors $T_{14}$ and $T_{12}$, i.e. the difference between these two collector currents $I_{c2}$ and $I_{c3}$ is available for driving the input transistor $T_{20}$ of the Schmitt trigger 20. As explained hereinbefore with reference to the diagrams presented in FIGS. 6 and 7, for small currents (plus or negative values of the control voltage E), the collector current $I_{c2}$ of the current source $T_{14}$ is always greater than the current $I_{c3}$ of the current sink $T_{12}$. Thus the current difference $I_{c2}-I_{c3}$ is always positive for negative control voltages E. The collector current of the transistor $T_{14}$, which forms the current source, increases only weakly, however, at higher currents so that away from a specific value of the control voltage the current $I_{c3}$ predominates and, in theory, a negative current difference occurs. The voltage increase across the resonance circuit L, C is limited when the aforementioned saturation of the transistor $T_{12}$ acting as a current sink occurs, in which case the impedance drops across the base bus of the transistors $T_{11}$, $T_{12}$, $T_1$ so that the resonance circuit L, C is subjected to a drastically heavier load (of more than the factor 100) and the amplification reduces. When the amplitude across the oscillating circuit has reached its maximum as a result of this limitation it reduces again in the same way in which it previously increased. The energy stored in the oscillating circuit causes the amplitude in the negative direction to become equal to that in the positive direction (a d-c. component i.e. asymmetry, is not possible in the oscillating circuit).

The level of the limitation is governed by the control voltage at which the difference in the impressed currents $I_{c2}-I_{c3}$ changes its sign. It is determined by the dimensioning or design of the emitter resistors $R_{11}$, $R_{12}$, $R_{14}$ and by the selection of the emitter surface ratios in the aforedescribed sense.

It is apparent from the foregoing details that the double current reflector or mirror in accordance with the invention simultaneously serves as a demodulator based upon the limiting influence or effect according to the curves g1, g2 shown in FIG. 7.

With regard to the foregoing explanations, it should be noted that the term "current mirror" implies, in the conventional sense, an exact proportionality of the currents in all arms or branches. This is likewise fulfilled for small currents when the current mirrors are in operation (curves a and c in FIG. 6). As a result of the intentional asymmetry in the emitter circuits, transfer functions are deliberately achieved which no longer exhibit a linear curve (curves b, d1 and d2 in FIG. 6). In accordance with the invention, the term "current mirror" embraces this fact.

By constructing the double current mirror in an oscillator/demodulator circuit arrangement, according to the invention, a series of advantages results. The limitation (note FIG. 7) is temperature-stable and occurs at values below approximately 200 mV, peak-to-peak. Furthermore, the loop amplification is higher and subject to less dispersion or straying.

The impedances at the compensating terminal 11 (external resistor $R_4$ in FIG. 2) can be selected to be lower and stray less than in the circuit arrangement shown in FIG. 1. Finally, the demodulation function which is simultaneously achieved is also temperature-stable, because no other diode-temperature coefficients need be taken into consideration. The demodulation curve has a steep gradient which corresponds to high amplification.

The foregoing is a description corresponding in substance to German Application P 34 25 937.6, dated July 13, 1984, the International priority of which is being claimed for the instant application and which is hereby made part of this application. Any material discrepancies between the foregoing specification and the aforementioned corresponding German application are to be resolved in favor of the latter.

We claim:

1. Oscillator/demodulator circuit arrangement for an inductive proximity switch with a transistor amplifier stage having an input circuit containing an attenuatable resonance circuit and having an output circuit, with a regenerative feedback from the output circuit to the input circuit of the transistor amplifier stage, the input circuit of the transistor amplifier stage having a limiter branch therein, comprising a double current mirror operatively connected in the input circuit of the transistor amplifier stage and including a first and a second current mirror coupled to one another in a manner that currents supplied thereby are subtracted from one another at a circuit output, the transistors in said second current mirror having a larger emitter surface ratio in comparison with the emitter surface ratio of the transistors in said first current mirror.

2. Circuit arrangement according to claim 1, wherein said first current mirror is located in the input circuit of the transistor amplifier stage and said second current mirror is driven by said first current mirror.

3. Circuit arrangement according to claim 1, wherein said first current mirror comprises a transistor connected as a diode and acting as reference element for said first current mirror and as compensation element for a threshold voltage of a base-emitter path of the transistor amplifier stage, two transistors commonly controlled by said first-mentioned transistor connected as a diode, and a respective resistor located in an emitter arm of the respective two controlled transistors.

4. Current arrangement according to claim 3, wherein said resistors in said emitter arms of said two control transistors of said first current mirror are of equal value.

5. Current arrangement according to claim 4 wherein said second current mirror has one transistor connected as a diode and acting as reference element, another transistor controlled by said one transistor, and a resistor located in an emitter arm of said other and controlled transistor.

6. Circuit arrangement according to claim 5 wherein said second current mirror is controlled by one of the two controlled transistors of said first current mirror.

7. Circuit arrangement according to claim 1 wherein said first and said second current mirrors have respective outputs which are interconnected to form said circuit output.

8. Circuit arrangement according to claim 6 wherein the transistors of said first current mirror are of the opposite conductivity type to that of the transistors of said second current mirror.

9. Circuit arrangement according to claim 6 wherein the transistors of said first current mirror have emitter surface ratios which are substantially equal to 1.

10. Circuit arrangement according to claim 6 wherein the emitter surface of said other and controlled transistor of said second current mirror is large compared to the emitter surface of said one transistor acting as reference element.

11. Circuit arrangement according to claim 10 wherein the emitter surface ratios of said one transistor acting as reference element and of said other and controlled transistor in said second current mirror are equal to 1:4.

12. Circuit arrangement according to claim 5 wherein the respective resistors in the emitter arms of the two controlled transistors of said first current mirror are greater than the resistor in the emitter arm of said other and controlled transistor of said second current mirror.

* * * * *